United States Patent [19]
Piesinger

[11] Patent Number: 5,369,366
[45] Date of Patent: Nov. 29, 1994

[54] METHOD OF FINDING FAULTS IN A BRANCHED ELECTRICAL DISTRIBUTION CIRCUIT

[75] Inventor: Gregory H. Piesinger, Cave Creek, Ariz.

[73] Assignee: Cable Repair Systems Corporation, Coral Springs, Fla.

[21] Appl. No.: 16,907

[22] Filed: Feb. 12, 1993

[51] Int. Cl.$^5$ .............................................. G01R 31/11
[52] U.S. Cl. .................................... 324/533; 324/534
[58] Field of Search ............... 324/512, 527, 532, 533, 324/534, 535

[56] References Cited

U.S. PATENT DOCUMENTS 5,083,086  1/1992  Steiner ................................ 324/533
5,185,579  2/1993  Mertens et al. ..................... 324/527

Primary Examiner—Kenneth A. Wieder
Assistant Examiner—Glenn W. Brown
Attorney, Agent, or Firm—Robert A. Parsons; Don J. Flickinger; Jordan M. Meschkow

[57] ABSTRACT

A PN modulated signal is applied to an end of a network electrical distribution circuit. The signal produces a snapshot trace of energy reflected from various discontinuities along the circuit, including a fault. Because the fault absorbs a large part of the energy in the applied signal, reflections from discontinuities in the same branch as the fault but farther from the input are reduced in amplitude. By knowing the position of the branches and various discontinuities, such as transformers, the position of the fault can be logically determined. If the fault is a high resistance fault a high voltage pulse is applied to the end of the circuit. The PN signal is initially sensed at a time when the fault has a low resistance because of arcing due to the high voltage pulse.

25 Claims, 2 Drawing Sheets

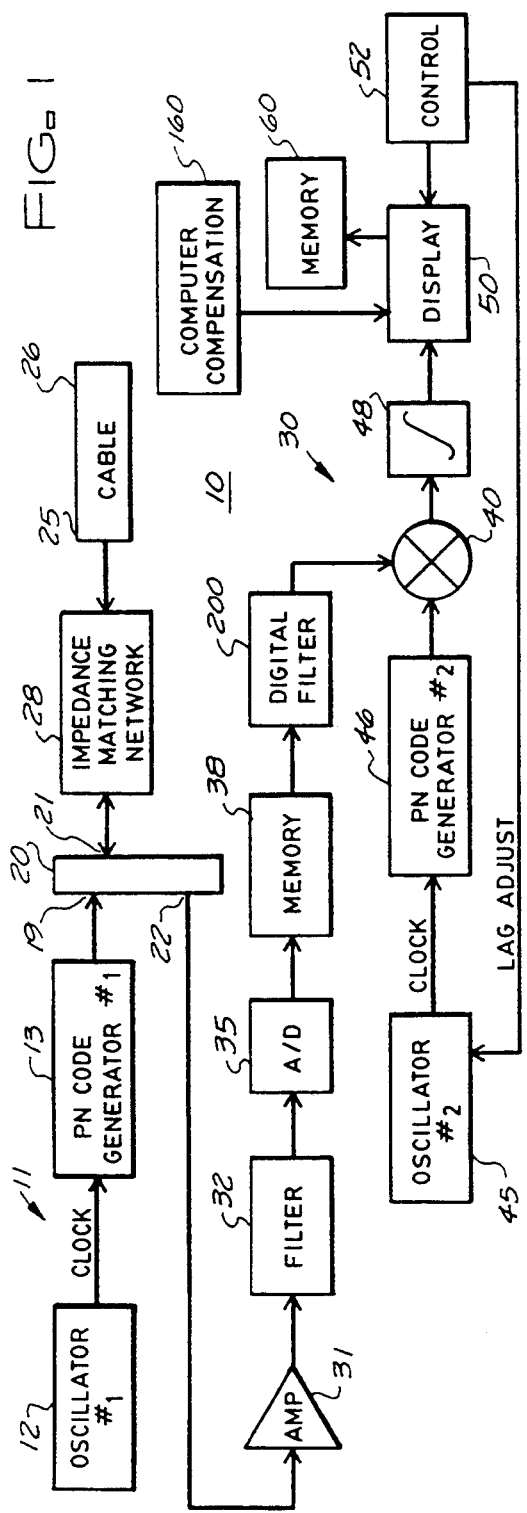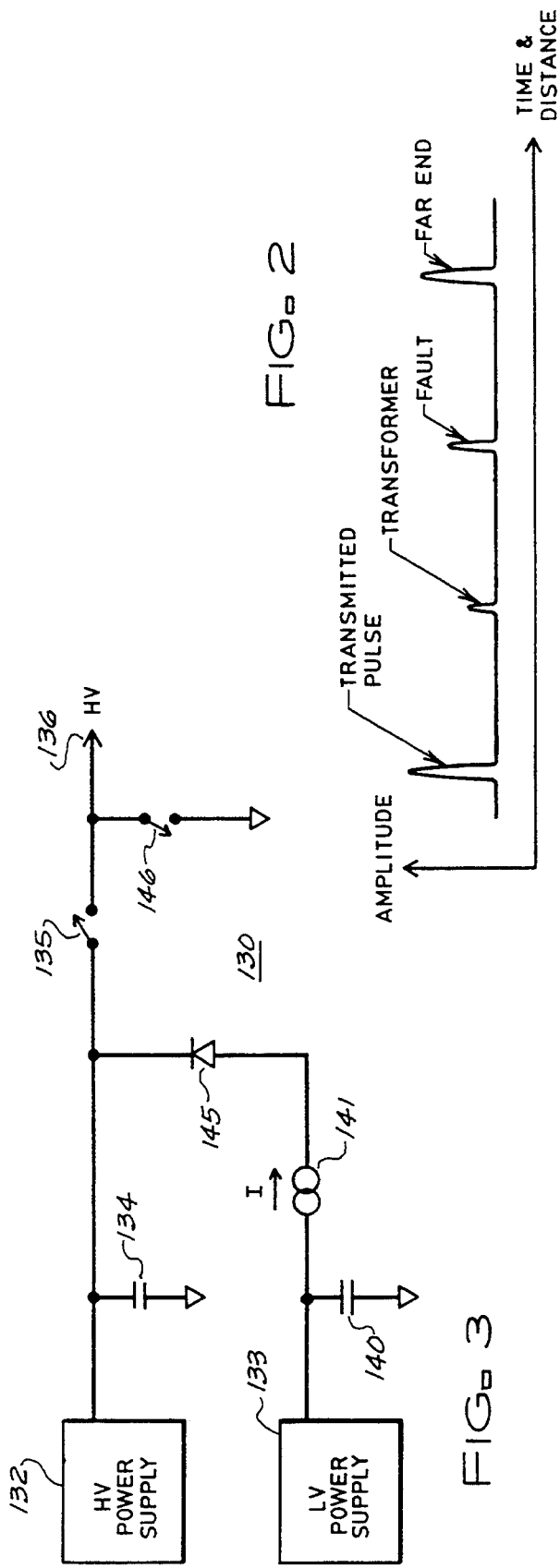

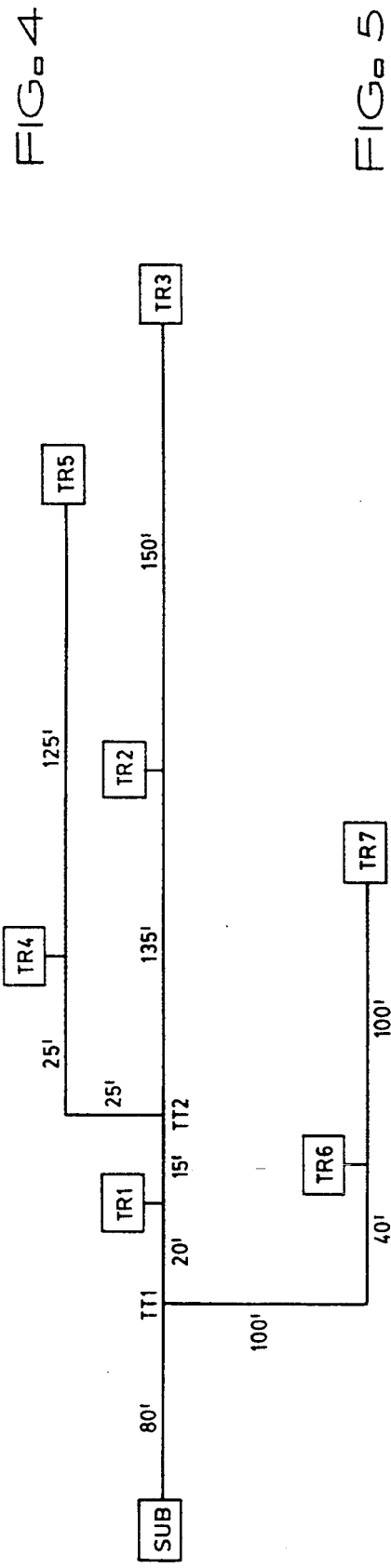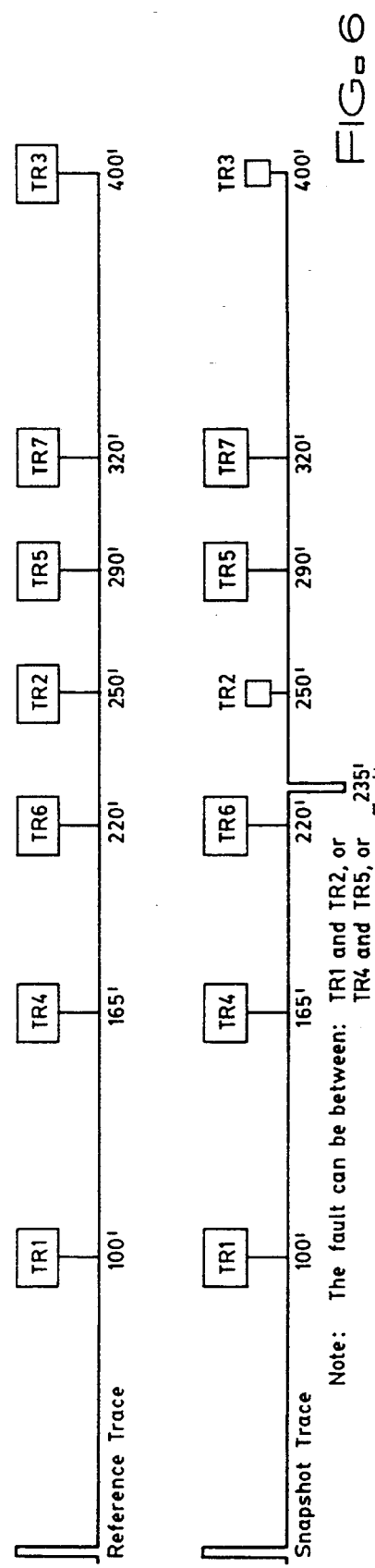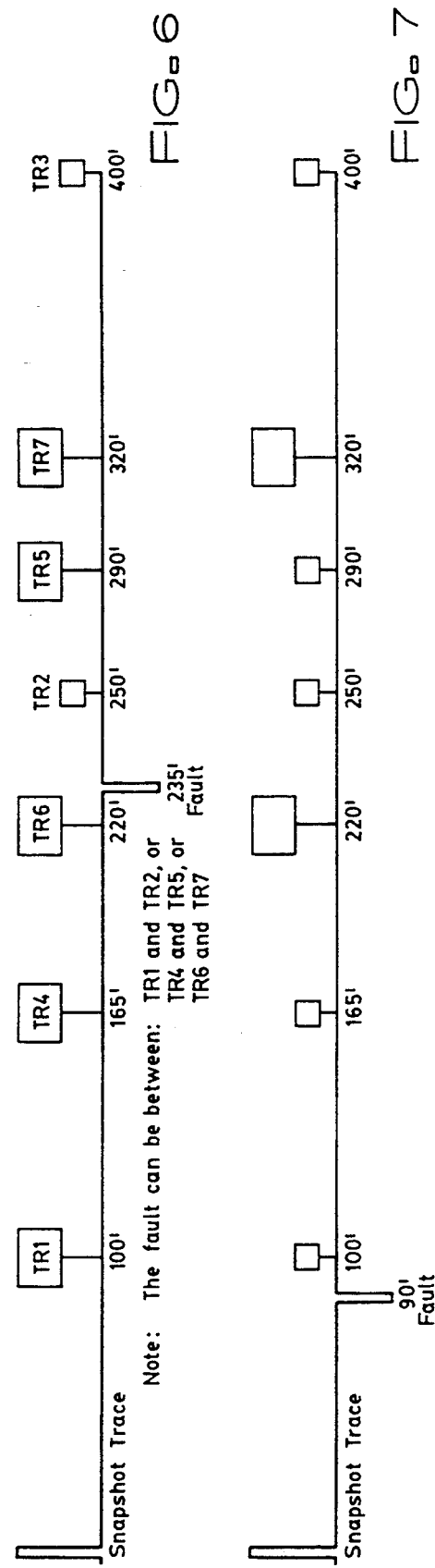

METHOD OF FINDING FAULTS IN A BRANCHED ELECTRICAL DISTRIBUTION CIRCUIT

FIELD OF THE INVENTION

The present invention pertains to a system for finding discontinuities in generally inaccessible cables and more specifically to a system for very accurately finding faults in power cable in branched electrical distribution circuits and the like.

BACKGROUND OF THE INVENTION

Branched distribution circuits, for purposes of this disclosure include any distribution circuits containing Ys, Ts or other branches. Branched circuits specifically include the normal neighborhood underground distribution system and, another common example which is utilized in this disclosure for purposes of explanation, is a network distribution circuit. Network electrical distribution circuits is a term utilized to describe power distribution systems in densely populated areas, such as inner cities, large buildings, etc. A single network electrical distribution circuit is typically three to five miles in total length, includes several branches and 50 or more transformers. Network electrical distribution circuits are designed to provide high service reliability. The distribution circuits accomplish this by routing two or more high (primary) voltage feeder cables from a single substation to a common usage point. At the common usage point, network transformers step down the primary voltage to levels commonly used in buildings, commercial establishments, and the like. The lower (secondary) voltages, which is typically 480 volts, are tied together on a common bus bar at the point of usage. In this manner, if one network transformer fails, then the remaining transformers can carry the load without any interruption to the customer.

A further feature of network electrical distribution circuits is that the network transformers are protected by devices called secondary network protectors. These secondary network protectors sense any secondary current back-flow from the secondary bus bar towards the primary side of the network transformer windings. This current back-flow is exactly the condition that occurs when a fault appears on a feeder cable. Thus, when a secondary network protector senses a current backflow condition, the current flow through that feeder is abruptly halted. When a fault (e.g., a path to ground) occurs on one feeder, other feeders connected at the same secondary bus bar attempt to back-feed current through the network transformer connected to the faulted feeder and, hence, to ground through the fault location. The secondary network protectors prevent this current back-flow by automatically sensing the back-flow condition and opening switches on the secondary side of the network transformers connected to the faulted feeder.

When a fault occurs on a network electrical distribution circuit, it compromises the redundancy afforded by the basic network design by taking away one of the feed sources to the common usage point. Accordingly, utilities must repair the fault as rapidly as possible in order to regain the design redundancy. Before repairs can begin, however, the exact location of the fault must be determined.

Currently, utility personnel locate faults in network electrical distribution circuits by using a device known in the industry as a "thumper". A thumper is basically a large capacitive discharge device that stores dc voltage (current) and periodically (e.g., every three seconds) discharges the stored energy into the distribution circuit. Energy introduced during the thumping process causes an audible "thump" at the fault location. The fault location is then determined by personnel positioned to hear and pinpoint the thump origin.

Thumping cables generally causes further damage to cables that are already in a weakened state, as evidenced by the existence of the fault. Thumping is also a time consuming operation which is counter to the goal of repairing the fault as quickly as possible.

SUMMARY OF THE INVENTION

It is an object of the present invention to provide a new and improved method for determining the position of faults in branched electrical distribution circuits.

It is a further object of the present invention to provide a new and improved method for determining the position of faults in branched electrical distribution circuits which is much simpler to use.

It is a further object of the present invention to provide a new and improved method for determining the position of faults in branched electrical distribution circuits which is much quicker and requires the use of fewer personnel than prior systems.

The above described problems and others are solved and the above objects and other objects are realized in a method of determining the position of a fault in a branched electrical distribution circuit including a plurality of branches, the method comprising the steps of determining the relative positions of a plurality of discontinuities in the distribution circuit, utilizing a cable-radar to produce a radar trace including a reflection from each discontinuity and a reflection from a fault in the distribution circuit, reflections from discontinuities in a branch containing the fault and farther from the cable-radar than the fault being diminished in size, and comparing the radar trace to the determined relative positions of the plurality of discontinuities and, utilizing the position of the fault and diminished reflections from discontinuities farther from the cable-radar, determining which of the plurality of branches contains the fault.

The above described problems and others are solved and the above objects and other objects are further realized in a method of determining the position of a high resistance fault in a branched electrical distribution circuit including a plurality of branches, the method comprising the steps of determining the relative positions of a plurality of discontinuities in the distribution circuit, utilizing a cable-radar in conjunction with a high voltage discharge to produce a radar trace including a reflection from each discontinuity and a reflection from a fault in the distribution circuit, reflections from discontinuities in a branch containing the fault and farther from the cable-radar than the fault being diminished in size, and comparing the radar trace to the determined relative positions of the plurality of discontinuities and, utilizing the position of the fault and diminished reflections from discontinuities farther from the cable-radar, determining which of the plurality of branches contains the fault.

BRIEF DESCRIPTION OF THE DRAWINGS

The foregoing and further and more specific objects and advantages of the instant invention will become readily apparent to those skilled in the art from the following detailed description of the preferred embodiment thereof taken in conjunction with the drawings in which:

Referring to the drawings:

FIG. 1 is a block diagram of a fault finding system;

FIG. 2 illustrates a cable return typical trace appearing on the system of FIG. 1;

FIG. 3 is a schematic/block diagram of a high voltage generating apparatus utilized in conjunction with the system of FIG. 1;

FIG. 4 is a block diagram of a network electrical distribution circuit, somewhat simplified for purposes of this discussion;

FIG. 5 is a reference trace of the distribution circuit of FIG. 4;

FIG. 6 is a snapshot trace taken of the distribution circuit of FIG. 4, with a fault in a first position, utilizing the fault finding system of FIG. 1; and FIG. 7 is a snapshot trace taken of the distribution circuit of FIG. 4, with a fault in a different position, utilizing the fault finding system of FIG. 1.

DETAILED DESCRIPTION OF THE PREFERRED EMBODIMENT

Discontinuities, including transformers, faults and splices in a single cable can be located by using a time domain reflectometer (TDR) also called a cable-radar. A TDR is an instrument that transmits a short electrical pulse into one end of a cable and then receives a return pulse that is reflected from the cable fault or splice point. A TDR operates on the principle that any discontinuity in the electrical impedance of the cable will reflect part of the transmitted pulse energy. Low resistance faults, opens, shorts, transformers and cable splices form such an impedance discontinuity and can therefore be detected using a TDR. The TDR only measures the electrical distance to the fault. For locating high resistance faults, the TDR is combined with a device known as a "thumper". A thumper is a piece of equipment that applies high voltage dc pulses into a sectionalized cable run. The thumper is used to induce arcing at the high resistance fault, thus producing a low resistance fault for a short time during the discharge arc period.

FIG. 1 illustrates a block diagram of a fault finding system, generally designated 10, which is explained more fully in a copending U.S. Patent Application entitled "FAULT AND SPLICE FINDING SYSTEM AND METHOD", filed 5 Nov. 1992, and bearing Ser. No. 07/972,240. It should be noted that fault finding system 10 is a device for finding discontinuities in conducting cables and the like. Generally, for simplicity, this explanation refers to discontinuities as faults, although they may be transformers, splices, weakened areas, or other discontinuities, and to system 10 as a fault finding system. Also, TDRs, fault finding systems and similar systems are referred to herein, and only for purposes of this disclosure, generally as cable-radar. Further, while the electrical cables referred to herein are generally illustrated as network electrical distribution circuits, it should be understood that any extended conductor and/or branched systems can be tested by the following methods, including overhead power cables, telephone lines, local area computer network cables, TV cables, etc. Also, because it is believed that fault finding systems are the most advantageous to utilize in the present method, a fault finding system will be utilized for the remainder of the disclosure.

Referring to FIG. 1, fault finding system 10 includes a signal generator 11 having a first oscillator 12 connected to provide a clocking signal to a pseudorandom noise (PN) code generator 13. In this particular embodiment oscillator 12 is a very stable crystal oscillator. The output from PN code generator 13 is supplied to an input terminal 19 of a power splitter 20. Power splitter 20 is a common RF power splitter, directional coupler, or similar power dividing or directing network, which provides substantially all of any RF power supplied to input/output terminal 21. Further, power supplied, externally, to input/output terminal 21 is coupled to output terminal 22. Input/output terminal 21 is coupled to a near end 25 of a branched electrical distribution circuit, which for purposes of this explanation is a network electrical distribution circuit 26 to be tested, by an impedance matching network 28. Generally, impedance matching network 28 is designed to match the impedance of fault finding system 10 to the impedance of distribution circuit 26 to get the most efficient transfer of energy therebetween.

Output terminal 22 of power splitter 20 is coupled to an input terminal of a monitor, generally designated 30. Thus, as stated above, power reflected from distribution circuit 26, through impedance matching network 28, to input/output terminal 21 of power splitter 20 is coupled to output terminal 22 and monitor 30. Input signals applied to the input terminal of monitor 30 are coupled through an appropriate amplifier 31 and filter 32 to an analog to digital (A/D) converter 35. A/D converter 35 is included to convert the signal received from distribution circuit 26 by way of output terminal 22 of power splitter 20 into clear chips of PN code. Digital signals from A/D converter 35 are stored in a high speed memory 38 for subsequent processing and display. Stored signals from memory 38 are applied to a first input of a multiplier circuit 40.

A second oscillator 45 is a very stable crystal oscillator similar to, and operating at the same frequency as, first oscillator 12. Separate oscillators 12 and 45 are utilized in this embodiment but it should be understood that a single oscillator, or a master/slave arrangement could be utilized in some specific applications. The output of oscillator 45 is applied as a clocking signal to the input of a PN code generator 46, which supplies a PN code that is identical to, and initially substantially in phase with, the PN code supplied by PN code generator 13. The PN code from PN code generator 46 is coupled to a second input of multiplier 40. The two signals coupled to the first and second inputs of multiplier 40 are multiplied together and the product is integrated in an integrator 48. The output of integrator 48 is supplied to an input of a display 50. A control 52 is connected to oscillator 45 to automatically adjust a lag in oscillator 45, one A/D sample at a time. Simultaneously, the output of control 52 is supplied to display 50 to continuously update the display, indicating the amount of lag being introduced, as a new lag is introduced into oscillator 45. It should be readily understood by those skilled in the art that when the signal generated by PN code generator 46 exactly correlates (zero lag) with the delayed signal received from distribution circuit 26 a peak of power will appear and be displayed by display 50. By utilizing the lag signal from control 52 to create a trace on display 50, the relative positions of the power peaks will be illustrated in a correct time relationship. To better understand this concept, a typical return trace from cable 26 is illustrated in FIG. 2.

When the signal generated by PN code generator 13 is originally applied to near end 25 of distribution circuit 26, a portion of that signal is digitally processed and supplied to the first input of multiplier 40. The portion of the original signal is reflected from the discontinuity presented by near end 25 of distribution circuit 26. The signal should have zero lag when correlated with the signal generated by PN code generator 46 and, therefore, produces a peak of power, designated the transmitted pulse, in FIG. 2. Smaller return signals may be, for example, reflected from transformers in distribution circuit 26, a low resistance fault in distribution circuit 26 and, finally, from the far end of various branches in distribution circuit 26. All of this information is stored in memory 38 for the subsequent processing. After the initial transmitted pulse, control 52 introduces a lag into oscillator 45, one A/D sample at a time and gradually produces a trace on display 50, one A/D sample at a time. For each lag of one sample, the output of PN code generator 46 is compared, or correlated, with the signal from memory 38. Each time that a return, or reflection, is present, a peak of power appears so that, as the autocorrelation progresses, a peak appears for the reflection from a transformer, for the reflection from the fault and for the reflection from the far ends of branches in distribution circuit 26.

System 10 previously described is utilized to locate low resistance faults, opens, splices, and the like. To locate high resistance faults a single shot high voltage dc generator 130, illustrated schematically in FIG. 3 is utilized in conjunction with impedance matching network 28. Generator 130 includes a high voltage power supply 132 and a low voltage power supply 133. High voltage supply 132 provides at least 25 thousand volts and may be variable to higher and lower voltages if desired. Low voltage supply 133 provides approximately 2000 volts and again may be variable over a range of voltages if desired. A high voltage capacitor 134 is connected between the output of high voltage supply 132 and ground. The output of high voltage capacitor 134 is connected through a relay, or high voltage switch 135 to an output terminal 136. A low voltage capacitor 140 is connected between the low voltage supply and ground. The output of low voltage capacitor 140 is connected through a current source 141 to the anode of a high voltage diode 145. The cathode of diode 145 is connected between high voltage capacitor 134 and relay 135. A manual safety switch 146 is connected between output terminal 136 and ground.

In operating, high voltage generator 130 is used in what is commonly known as the arc reflection method of locating faults in underground distribution cables. High voltage power supply 132 charges high voltage capacitor 134 up to as high as 25 KV or more. Capacitor 134 is only a few tenths of a microfarad and is used to simply supply enough energy to initiate an arc in distribution circuit 26 at the fault site. Low voltage power supply 133 charges low voltage capacitor 140 up to approximately 2000 volts. Capacitor 140 is typically a few tens of microfarads (e.g., 25 microfarads) and is discharged through current source 141 to maintain the low voltage arc in distribution circuit 26 once it is initiated by the energy in capacitor 134. To locate high resistance faults, signal generator 11 is combined with high voltage generator 130. Monitor 30 contains sufficient storage capacity in memory 38 to take a snapshot of the reflected pulses (similar to FIG. 2) during the high voltage discharge arc. The low resistance arc fault is thus captured by monitor 30 when it is physically connected to near end 25 of distribution circuit 26 through power splitter 20 and the time T will be indicated. The location of the discharge fault is then found in the same manner as were low resistance faults and splices. It is not generally necessary to apply a high voltage discharge to the cable more than once to find and mark the high resistance fault location.

FIG. 4 is a block diagram of a network electrical distribution circuit, somewhat simplified for purposes of this discussion. FIG. 4 also illustrates various known discontinuities in the network electrical distribution circuit, such as transformers TR1 through TR7, as well as distances to the discontinuities and positions of various branches in the distribution circuit. In some instances an accurate map of specific network electrical distribution circuits is available and can be utilized to determine the relative positions of discontinuities, such as transformers, positions of various branches and which transformers are on the various branches. In some instances such a map is not available and it is necessary to manually determine positions of at least some of the transformers, branches, etc. This can be done in several ways, depending upon the specific distribution circuit. For example, one person can operate the fault finding system and a second person can produce shorts in the primary windings of various transformers. These shorts clearly effect the reflected return seen in the trace at the fault finding system and several or all of the transformers can be identified and tagged on the reference trace. In another method, monitor 30 can be supplied with an antenna (as explained fully in the copending application identified above) and while one person supplies signals to the near end of the distribution circuit another person utilizes the antenna and monitor to identify and tag various transformers.

Once a map is obtained or otherwise provided, a reference trace of the distribution circuit is taken to determine the relative positions of the various discontinuities. A typical reference trace for the distribution circuit of FIG. 4 is illustrated in FIG. 5. It is, of course, preferable to have the map and take the reference trace prior to the occurrence of any difficulties in the distribution circuit. However, in many instances this will not occur, or be possible. If the fault in the distribution circuit is a high resistance fault, a satisfactory reference trace can be taken simply by not utilizing a high voltage discharge from high voltage generator 130. Upon determining the relative positions of the various known discontinuities in the distribution circuit, in any of the methods described above or any other convenient method, a snapshot trace of the distribution circuit is taken. A typical snapshot trace is illustrated in FIG. 6 and illustrates the known discontinuities shown in the reference trace of FIG. 5, as well as the typical negative going pulse produced by a short in the circuit.

Referring to the snapshot trace of FIG. 6, it can be seen that the fault occurs at 235 feet from the near end of the distribution circuit. This information comes from the fault finding system. Next it can be seen from the snapshot trace of FIG. 6 that the energy reflected from two discontinuities, transformers TR2 and TR3, is diminished in size. To understand this phenomenon it must be realized that short range discontinuities (such as the low resistance arc fault) reflect significant energy, thus leaving less energy available to illuminate discontinuities further down the cable. This reduced incident energy on distant discontinuities produces reflections which are diminished in size.

Utilizing the information determined in advance, i.e. a map such as FIG. 4, the reference trace of FIG. 5 and the snapshot trace of FIG. 6, the position of the fault is logically determined. For example, by knowing that the fault is 235 feet from the near end of the distribution circuit, one can logically determine that the fault lies between TR1 and TR2, or TR4 and TR5, or TR6 and TR7. By comparing the snapshot trace of FIG. 6 to the reference trace of FIG. 5, it can be seen that the reflections from TR2 and TR3 are diminished in size. Since both TR2 and TR3 are in the same branch and are farther than 235 feet from the near end of the distribution circuit, it is deduced that the fault lies between TR1 and TR2 and is in the same branch as TR2 and TR3. Thus, the position of the fault is accurately determined.

Utilizing the same distribution circuit as mapped in FIG. 4 and the reference trace of FIG. 5, a different fault is assumed to further illustrate the method utilized. In this instance a snapshot trace, illustrated in FIG. 7 is taken in which none of the transformers or other discontinuities have been tagged, or otherwise identified relative to the map of FIG. 4. From the snapshot trace of FIG. 7 it can be seen that the fault is 90 feet from the near end of the distribution circuit. By looking at the circuit map of FIG. 4, it is clear that this fault must be on either the main (center) branch or on the lower branch, since the upper branch is 115 feet from the near end of the distribution circuit. The snapshot trace of FIG. 7 also shows that the returns from five transformers have diminished in size. By knowing the number of transformer returns that have diminished in size and applying logic, it is apparent that the fault must be on the main branch. This is true because only the main branch and the upper branch contain five transformers beyond the 90 foot point. The other possibility, the lower branch, contains only two transformers beyond the 90 foot point. Thus, the position of the fault is again accurately determined.

The examples depicted in FIGS. 4 through 7 are simplified ones, but the principle holds for more complex circuits and fault positions. Usually, there will be only one combination of distance from the near end (or substation) of the distribution circuit and the number of transformer returns beyond the fault that diminish in size. Such a unique combination unequivocally fixes the branch of the distribution circuit on which the fault must lie. In the unusual circumstance in which a fault location as measured by the distance from the near end (substation) can be on two or more branches and simultaneously, the number of transformers with diminished returns beyond the fault is also identical on each of the two or more branches, the specific branch containing the fault is unclear. In this instance, an operator must tag, or identify, a transformer proximate to but beyond the indicated fault distance on one of the branches possibly containing the fault. If the tagged transformer is one of the transformers with a return that is diminished in size, then the branch containing the fault is identified.

In some specific network electrical distribution circuits it is possible to load the map and any other identifying and circuit information into a computer database. When a fault occurs in the distribution circuit the measurements are made utilizing a fault finding system, much of which could also be incorporated into the computer. Then by utilizing appropriate software that makes the necessary observations and applies the correct logic the exact position of the fault could be quickly and easily determined.

Thus, a new and improved method for determining the position of faults in branched and, specifically network, electrical distribution circuits is disclosed. Further the new and improved method for determining the position of faults in branched electrical distribution circuits is much simpler to use, is much quicker and requires the use of fewer personnel than prior systems. Also the present system eliminates the need for a physically large thumper unit and prevents the damaging effects of over thumping the cable, because a thumper is not required to pinpoint the fault location. The fault is pinpointed by receiving normal low voltage electrical pulses via system 10. It is not necessary to produce an audible discharge arc. Therefore, a physically small man-portable low-current, low-repetition-rate high-voltage discharge device is used.

While I have shown and described specific embodiments of the present invention, further modifications and improvements will occur to those skilled in the art. I desire it to be understood, therefore, that this invention is not limited to the particular forms shown and I intend in the append claims to cover all modifications that do not depart from the spirit and scope of this invention.

Having fully described the invention in such clear and concise terms as to enable those skilled in the art to understand and practice the same, the invention claimed is:

1. A method of determining the position of a fault in a branched electrical distribution circuit including a plurality of branches, the method comprising the steps of:

determining the relative positions of a plurality of discontinuities in the distribution circuit;

utilizing a cable-radar to produce a radar trace including a reflection from each discontinuity and a reflection from a fault in the distribution circuit, reflections from discontinuities in a branch containing the fault and farther from the cable-radar than the fault being diminished in size; and comparing the radar trace to the determined relative positions of the plurality of discontinuities and, utilizing the position of the fault and diminished reflections from discontinuities farther from the cable-radar, determining which of the plurality of branches contains the fault.

2. A method as claimed in claim 1 wherein the step of determining the relative positions of the plurality of discontinuities includes utilizing only the cable radar to produce a reference trace.

3. A method as claimed in claim 2 wherein the step of determining the relative positions of a plurality of discontinuities further includes utilizing a monitor coupled to an antenna at several accessible discontinuities to identify discontinuities in at least some of the branches.

4. A method as claimed in claim 2 wherein the step of determining the relative positions of a plurality of discontinuities further includes producing shorts at several accessible discontinuities to identify discontinuities in at least some of the branches.

5. A method as claimed in claim 4 wherein a plurality of the discontinuities are power transformers with primary windings and the step of determining the relative positions of a plurality of discontinuities further includes producing a short in a circuit containing the primary winding of at least one of the plurality of transformers.

6. A method as claimed in claim 1 wherein the step of determining the relative positions of a plurality of discontinuities includes providing an accurate map of the distribution circuit containing information as to distances and positions of known discontinuities.

7. A method of determining the position of a high resistance fault in a branched electrical distribution circuit including a plurality of branches, the method comprising the steps of:
   determining the relative positions of a plurality of discontinuities in the distribution circuit;
   utilizing a cable-radar in conjunction with a high voltage discharge to produce a radar trace including a reflection from each discontinuity and a reflection from a fault in the distribution circuit, reflections from discontinuities in a branch containing the fault and farther from the cable-radar than the fault being diminished in size; and
   comparing the radar trace to the determined relative positions of the plurality of discontinuities and, utilizing the position of the fault and diminished reflections from discontinuities farther from the cable-radar, determining which of the plurality of branches contains the fault.

8. A method as claimed in claim 7 wherein the step of determining the relative positions of a plurality of discontinuities includes utilizing only the cable radar to produce a reference trace.

9. A method as claimed in claim 7 wherein the step of determining the relative positions of a plurality of discontinuities further includes utilizing a monitor coupled to an antenna at several accessible discontinuities to identify discontinuities in at least some of the branches.

10. A method as claimed in claim 7 wherein the step of determining the relative positions of a plurality of discontinuities further includes producing shorts at several accessible discontinuities to identify discontinuities in at least some of the branches.

11. A method as claimed in claim 10 wherein a plurality of the discontinuities are power transformers with primary windings and the step of determining the relative positions of a plurality of discontinuities further includes producing a short in a circuit containing the primary winding of at least one of the plurality of transformers.

12. A method as claimed in claim 7 wherein the step of determining the relative positions of a plurality of discontinuities includes providing an accurate map of the distribution circuit containing information as to distances and positions of known discontinuities.

13. A method of determining the position of a fault in a branched electrical distribution circuit including a plurality of branches, the method comprising the steps of:
   utilizing a cable-radar to produce a reference trace including a reflection from each discontinuity in the distribution circuit;
   identifying and tagging the relative positions of a plurality of discontinuities in the distribution circuit which appear in the reference trace;
   utilizing a cable-radar to produce a radar trace including a reflection from each discontinuity and a reflection from a fault in the distribution circuit, reflections from discontinuities in a branch containing the fault and farther from the cable-radar than the fault being diminished in size, and
   comparing the radar trace to the reference trace and, utilizing the position of the fault and diminished reflections from discontinuities farther from the cable-radar, determining which of the plurality of branches contains the fault and the position of the fault in the branch.

14. A method as claimed in claim 13 wherein the step of identifying and tagging the relative positions of a plurality of discontinuities includes utilizing a monitor coupled to an antenna at several accessible discontinuities to identify discontinuities in at least some of the branches.

15. A method as claimed in claim 13 wherein the step of identifying and tagging the relative positions of a plurality of discontinuities includes producing shorts at several accessible discontinuities to identify discontinuities in at least some of the branches.

16. A method as claimed in claim 15 wherein a plurality of the discontinuities are power transformers with primary windings and the step of identifying and tagging the relative positions of a plurality of discontinuities further includes producing a short in a circuit containing the primary winding of at least one of the plurality of transformers.

17. A method as claimed in claim 13 wherein the step of identifying and tagging the relative positions of a plurality of discontinuities further includes providing an accurate map of the distribution circuit containing information as to distances and positions of known discontinuities.

18. A method of determining the position of a fault in a branched electrical distribution circuit including a plurality of branches, the method comprising the steps of:
   introducing a pulsed electrical signal into a near end of the branched electrical distribution circuit, the pulsed electrical signal producing a plurality of reflected pulses of electrical energy representative of the reflected electrical energy from each of a plurality of discontinuities and reflected electrical energy from a fault in the distribution circuit;
   sensing, adjacent the near end of the cable, the plurality of reflected pulses of electrical energy representative of the reflected electrical energy from each of a plurality of discontinuities and reflected electrical energy from a fault in the distribution circuit, pulses reflected from discontinuities in a branch containing the fault and farther from the cable-radar than the fault being diminished in size; and
   determining the position of the fault in the distribution circuit from the return time of the reflected electrical energy from the fault in the distribution circuit and determining the branch containing the fault from the diminished size of discontinuities in the branch containing the fault and farther from the cable-radar than the fault.

19. A method as claimed in claim 18 including in addition a step of determining the relative positions of a plurality of discontinuities in the distribution circuit including utilizing a cable-radar to produce a reference trace with a reflection from each discontinuity in the distribution circuit and identifying and tagging the relative positions of a plurality of discontinuities in the distribution circuit which appear in the reference trace.

20. A method as claimed in claim 18 wherein the step of introducing a pulsed electrical signal into a near end of the distribution circuit includes the step of utilizing pulse compression to produce the pulsed electrical signal.

21. A method as claimed in claim 20 wherein the step of utilizing pulse compression includes the step of continuously clocking a pseudo-random noise code generator to produce the pulsed electrical signal.

22. A method as claimed in claim 21 wherein the step of continuously clocking the pseudo-random noise code generator includes utilizing an oscillator to produce clocking signals.

23. A method as claimed in claim 18 wherein the fault is a high resistance fault, the method further includes the step of introducing a relatively high voltage discharge into the near end of the distribution circuit prior to the step of introducing a pulsed electrical signal into the near end of the distribution circuit.

24. A method as claimed in claim 23 wherein the step of introducing a pulsed electrical signal into the near end of the electrical cable is performed as the relatively high voltage discharge introduced into the near end of the electrical cable reduces the high resistance fault to a relatively low resistance fault.

25. A method as claimed in claim 18 including in addition the step of introducing into a computer all information known about the branched electrical distribution network, and wherein the step of determining the position of the fault and the branch containing the fault is performed by the computer.

* * * * *